(12) United States Patent
Sato

(10) Patent No.: US 6,522,184 B2
(45) Date of Patent: Feb. 18, 2003

(54) FLIP-FLOP CIRCUIT

(75) Inventor: Yuichi Sato, Mie-Ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/052,554

(22) Filed: Jan. 23, 2002

(65) Prior Publication Data

US 2002/0097076 A1 Jul. 25, 2002

Related U.S. Application Data

(62) Division of application No. 09/192,505, filed on Nov. 17, 1998, now Pat. No. 6,369,629.

(30) Foreign Application Priority Data

Nov. 19, 1997 (JP) .............................................. 9-317912

(51) Int. Cl.[7] .............................................. H03K 3/289
(52) U.S. Cl. ...................... 327/203; 327/212; 327/214; 326/98
(58) Field of Search .......................... 327/185, 199–203, 327/208, 210, 211, 212, 214–218, 224, 225; 326/93–98; 377/115–117; 365/205, 230.08

(56) References Cited

U.S. PATENT DOCUMENTS

| | | | | |
|---|---|---|---|---|
| 4,484,087 A | * | 11/1984 | Mazin et al. ................ | 327/203 |
| 4,656,368 A | * | 4/1987 | McCombs et al. ............. | 326/95 |
| 5,036,217 A | | 7/1991 | Rollins et al. ............... | 327/203 |
| 5,155,382 A | * | 10/1992 | Madden et al. ............. | 327/198 |
| 5,825,224 A | | 10/1998 | Klass et al. .................. | 327/200 |
| 5,917,355 A | | 6/1999 | Klass .......................... | 327/208 |
| 5,933,038 A | | 8/1999 | Klass .......................... | 327/208 |

OTHER PUBLICATIONS

Neil H.E. Weste; (TLW, Inc.) and Kamran Eshraghian (University of Adelaide); Principles of CMOS VLSI Design; A Systems Perspective; p. 325; 1993.

* cited by examiner

Primary Examiner—Timothy P. Callahan
Assistant Examiner—Minh Nguyen
(74) Attorney, Agent, or Firm—Birch, Stewart, Kolasch & Birch, LLP

(57) ABSTRACT

In a flip-flop circuit, a master latch has a data input circuit that reads data when a clock input signal is at a first level. When the clock input signal is at a second level, a first data holding circuit holds the data, and a signal switching circuit transfers the data to a slave latch. The slave latch reads the data from a data output circuit when the clock input signal is at the second level. When the clock input signal returns to the first level, a second data holding circuit holds the data read from the data output circuit.

23 Claims, 7 Drawing Sheets

FLIP-FLOP CIRCUIT

This application is a Divisional of application Ser. No. 09/192,505, filed on Nov. 17, 1998, now U.S. Pat. No. 6,369,629 BI issued Apr. 9, 2002, the entire contents of which are hereby incorporated by reference and for which priority is claimed under 35 U.S.C. 120; and this application claims priority of application number H9/317912 filed in Japan on Nov. 19, 1997 under 35 U.S.C. 119.

BACKGROUND OF THE INVENTION

1. Field of the Invention

The present invention relates to a static-type master-slave flip-flop circuit.

2. Description of the Prior Art

With the advancement of micromachining and related technologies, LSIs (large-scale integrated circuits) have come to offer increasingly high operation speeds and increasingly high degrees of integration. To make high-speed LSIs commercially viable, it is essential to minimize their power consumption. This is because the higher the speed at which an LSI operates, the higher its power consumption, and, to stabilize its operation, it becomes necessary to provide it with some heat dissipation means such as a ceramic package or heat radiating fins. Inconveniently, this requires extra cost.

Moreover, in those small-size and light-weight portable appliances that have been gaining popularity in recent years, reduction of power consumption is essential also from the viewpoint of the duration of the battery by which they are powered. In particular, with flip-flop circuits operating at high speeds, which are prone to extremely high power consumption, it is advisable to adopt circuit designs that minimize power consumption.

Conventionally, static-type master-slave flip-flop circuits that employ CMOS FETs (complementary metal-oxide semiconductor field-effect transistors) are widely used for their high-speed operation and comparatively low power consumption. FIG. 8 shows an example of such a conventional static-type master-slave flip-flop circuit. How this flip-flop circuit is configured and how it operates will be described below.

In FIG. 8, D represents a data input signal, CK represents a clock input signal, and Q represents a data output signal. The clock signal CK that has been fed to the flip-flop circuit is first inverted by the inverter circuit 200 to produce a signal CKX, which is then once again inverted by the inverter circuit 201 to produce a signal CK1. The signals CKX and CK1 are applied to the transfer gates 202, 205, 206, and 209 to turn them on/off in an appropriate manner.

FIG. 9 is a diagram illustrating the configuration of one of those transfer gates on the level of its constituent transistors. The transfer gate is composed of an N-channel MOS FET (hereafter referred to simply as an "NMOS transistor") 210 and a P-channel MOS FET (hereafter referred to simply as a "PMOS transistor") 211 connected in parallel. The NMOS and PMOS transistors 210 and 211 are turned on/off by receiving at their gates the signals CK and CKX respectively, which are inverted with respect to each other.

For example, when the signal CK is at a high level and the signal CKX is at a low level, the NMOS and PMOS transistors 210 and 211 are both turned on, connecting the two ends A and Y of the transfer gate to each other. On the other hand, when the signal CK is at a low level and the signal CKX is at a high level, the NMOS and PMOS transistors 210 and 211 are both turned off, disconnecting the two ends A and Y of the transfer gate from each other.

In the circuit shown in FIG. 8, when the clock input signal CK is at a low level, the inverter circuits 200 and 201 turn the signal CKX to a high level and turn the signal CK1 to a low level. This turns the transfer gate 202 on, and thus the master latch delivers the data input signal D to the node 220. When the data input signal D is at a low level, the inverter circuit 203 turns the level at the node 221 to a high level, and the inverter circuit 204 turns the level at the node 222 to a low level. At this time, the transfer gates 205 and 206 remain off, and thus the data delivered to the master latch is not transferred to the slave latch.

Next, when the clock signal CK turns to a high level, the inverter circuits 200 and 201 turn the signal CKX to a low level and turn the signal CK1 to a high level. This turns the transfer gate 202 off and turns the transfer gates 205 and 206 on. Thus, in the master latch, the data fed thereto is held by the inverter circuits 203 and 204 and the transfer gate 205.

Moreover, the transfer gate 206 thus turned on causes the signal present at the node 221 to be delivered to the node 223 of the slave latch. Thus, the inverter circuit 207 turns the data output signal Q to a low level, and the inverter circuit 208 turns the level at the node 224 to a high level. At this time, the transfer gate 209 remains off.

Next, when the clock signal CK turns to a low level, the transfer gate 206 is turned off, and the transfer gate 209 is turned on. Thus, in the slave latch, the data is held so that the data output signal Q will be kept at a low level.

In this way, when the clock signal CK is at a low level, the data input signal D is fed to the master latch, and, when the clock signal CK turns to a high level, the data is transferred to the slave latch, causing the data output signal Q to be output. Thereafter, when the clock signal CK turns back to a low level, the slave latch holds the data output signal Q. In a similar manner, when the data input signal D is at a high level, a high level is output as the data output signal Q.

However, in this conventional flip-flop circuit (FIG. 8), every time the clock signal CK changes its level, and regardless of the level of the data input signal D. currents flow to charge/discharge the gate capacitors in the six PMOS and six NMOS transistors constituting the inverter circuits 200 and 201 and the transfer gates 202, 205, 206, and 209 as well as the drain capacitors within the inverter circuits 200 and 201.

Moreover, in the inverter circuits 200 and 201, which are each composed of a PMOS transistor and an NMOS transistor connected in series, there appears, just when the clock input signal CK changes its level, a period in which the PMOS and NMOS transistors are both kept on simultaneously. During this period, a current (called a through current) flows from the supplied voltage directly to ground GND, increasing power consumption.

Furthermore, as shown in FIG. 10, a PMOS transistor is on when its gate voltage is in a range R1 lower than a voltage VDD−VthP, which equals to its threshold voltage VthP subtracted from the supplied voltage VDD; on the other hand, an NMOS transistor is on when its gate voltage is in a range R2 higher than its threshold voltage Vthn.

For example, in any of the above-mentioned inverter circuits, before the clock signal fed thereto starts rising, i.e. when it is at a low level, the PMOS transistor is on and the NMOS transistor is off. When the clock signal reaches the voltage Vthn, the NMOS transistor, which receives the clock signal at its gate, is turned on. When the clock signal reaches the voltage VDD−VthP, the PMOS transistor is turned off.

Thus, while the signal CKX is rising, there appears, starting when the signal CKX reaches the voltage Vthn and ending when it reaches the voltage VDD−VthP, a period in which the NMOS transistor of the transfer gate 202 and the PMOS transistor of the transfer gate 205 are both kept on simultaneously. Similarly, while the signal CK1 is falling, there appears a period in which the PMOS transistor of the transfer gate 202 and the NMOS transistor of the transfer gate 205 are kept on simultaneously.

As a result, when the data that is to be received next happens to be contrary to the data already held in the master latch, a through current flows through the transfer gates 202 and 205 between the data input signal D and the output of the inverter circuit 204. Similarly, also when data is fed from the master latch to the slave latch, if the output of the inverter circuit 203 is contrary to the output of the inverter circuit 208, a through current flows through the transfer gates 206 and 209.

Moreover, the signals CKX and CK1, which are produced by the inverter circuits 200 and 201, have a phase difference, which prevents the transfer gates 202 and 205 from being turned on/off simultaneously at all times. This causes a through current to flow through the transfer gates 202 and 205 when the data input signal D is contrary to the output of the inverter circuit 204.

Furthermore, this conventional flip-flop circuit (FIG. 8) operates on the signals CKX and CK1 that it produces by the use of the inverter circuits 200 and 201 from the clock signal CK it receives. That is, this flip-flop circuit operates with a delay with respect to the clock input signal CK it receives, and therefore it requires, at trailing edges of the clock input signal CK, a sufficiently long data hold time to ensure that data is held securely in the master latch.

SUMMARY OF THE INVENTION

An object of the present invention is to provide a CMOS flip-flop circuit that operates with markedly low power consumption.

To achieve the above object, according to one aspect of the present invention, a static CMOS flip-flop circuit is composed of a master latch and a slave latch and operates on a data input signal and a clock input signal fed thereto. Here, the master latch has: a data input circuit that, when the clock input signal is at a first level, reads the data input signal; a first data holding circuit that, when the clock input signal is at a second level, holds the data read by the data input circuit; and a signal switching circuit that, when the clock input signal is at the first level, outputs a predetermined level and that, when the clock input signal is at the second level, outputs the data held by the first data holding circuit after inverting it. On the other hand, the slave latch has: a data output circuit that, when the clock input signal is at the second level, reads an output of the signal switching circuit after inverting it; and a second data holding circuit that, when the clock input signal is at the first level, holds the data read by the data output circuit.

Configured as described above, this flip-flop circuit reads the data input signal by the use of the data input circuit provided in the master latch when the clock input signal is at a first, e.g. low, level. Irrespective of the level of the data, the signal switching circuit outputs a predetermined, e.g. high, level. This inhibits the operation of the data output circuit in the slave latch, and thus the data is not transferred. Next, when the clock input signal changes to a second, e.g. high, level, the master latch activates the first data holding circuit to hold the data read by the data input circuit. Then, the signal switching circuit outputs the data held in the first data holding circuit after inverting it. While the clock input signal is at the second level, the slave latch reads, by the use of the data output circuit, the output of the signal switching circuit after inverting it. When the clock input signal changes back to the first level, the data thus read is held by the second data holding circuit. In this way, the output signal of the flip-flop circuit is obtained. Then, the master latch reads new data, and thus the flip-flop circuit operates in synchronism with the input signal. In this way, the output of the flip-flop circuit is kept stable.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
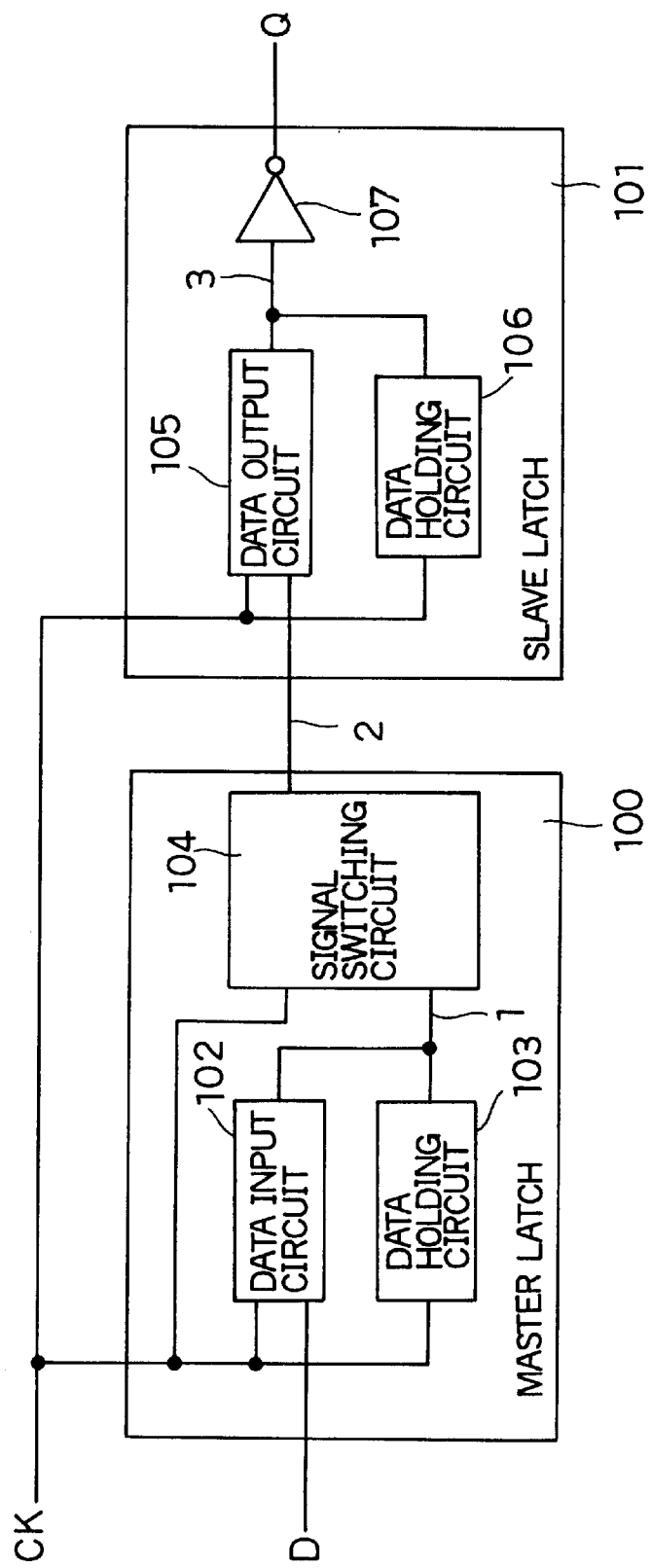
FIG. 1 is a block diagram illustrating the basic concept common to all embodiments of the invention.

Hereinafter, embodiments of the present invention will be described with reference to the drawings. FIG. 1 is a block diagram illustrating the basic concept common to all embodiments of the invention that will be dealt with in the following descriptions. As shown in this figure, a flip-flop circuit according to the invention consists of a master latch 100 and a slave latch 101. The master latch 100 is fed with a clock input signal CK and a data input signal D. The master latch 100 is provided with a data input circuit 102, a data holding circuit 103, and a signal switching circuit 104. On the other hand, the slave latch 101 is provided with a data output circuit 105, a data holding circuit 106, and an inverter circuit 107.

In the master latch 100, when the clock input signal CK is at a high level, the data input circuit 102 reads the data input signal D, and sets the level at the node 1 according to the level of the data input signal D. The signal switching circuit 104, which is configured as a NND, NOR, or similar gate, keeps the node 2 at a high level by the use of the clock input signal CK. Meanwhile, in the slave latch 101, the data output circuit 105 is maintained inactive so that no data may be transferred.

Next, when the clock input signal CK turns to a low level, the data holding circuit 103 maintains the level at the node 1 as before (irrespective of the level of the data input signal D). The signal switching circuit 104 sets the level at the node 2 according to the level at the node 1. In the slave latch 101, the data output circuit 105 reads the level at the node 2, and sets the level at the node 3 according to the level at the node 2. In FIG. 1, a data output signal Q is obtained from the node 3 through the inverter circuit 107, but it may be obtained in any other manner.

Next, when the clock input signal CK turns back to a high level, in the master latch, the data input circut 102 reads the data input signal D. In the slave latch 101, the data at the node 2 is no longer read, and instead the data holding circuit 106 maintains the level at the node 3 as it is. In this way, the data output signal Q is kept stable.

Figure 8:
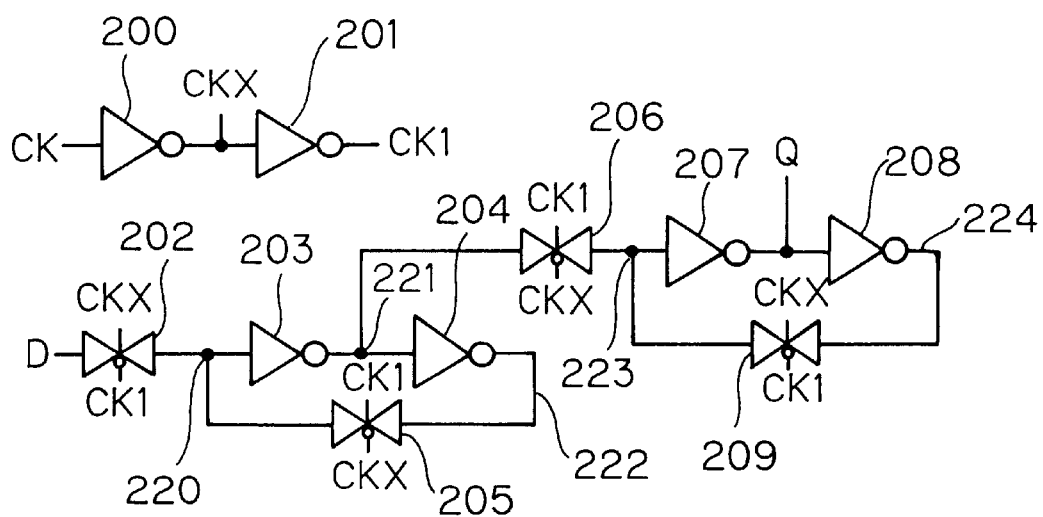
FIG. 8 is a circuit diagram of a conventional flip-flop circuit.
Figure 9:
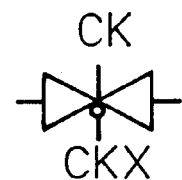
FIG. 9 is a circuit diagram of one of the transfer gates used in the conventional flip-flop circuit shown in FIG. 8.
Figure 9:
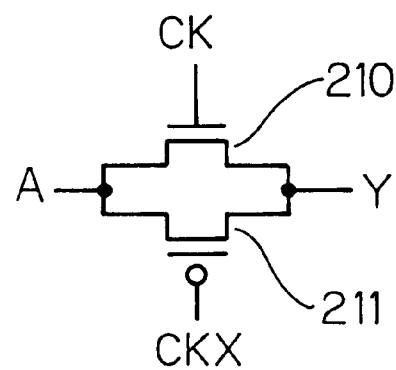
Figure 10:
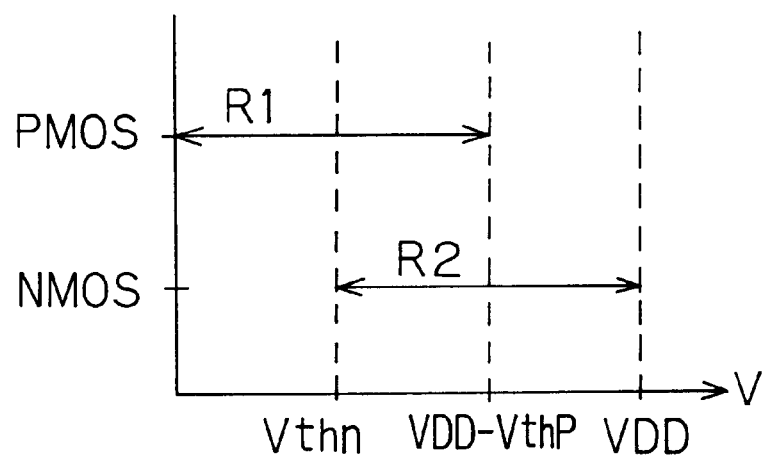
FIG. 10 is a diagram illustrating the relationship between the gate voltage and the on/off states of PMOS and NMOS transistors.

The conventional flip-flop circuit described earlier (FIG. 8) employs transfer gates (FIG. 9). By contrast, the. flip-flop circuit of any of the embodiments described below employs no transfer gate, and thus operates on a single-phase, single-polarity clock input signal CK alone.

Figure 2:
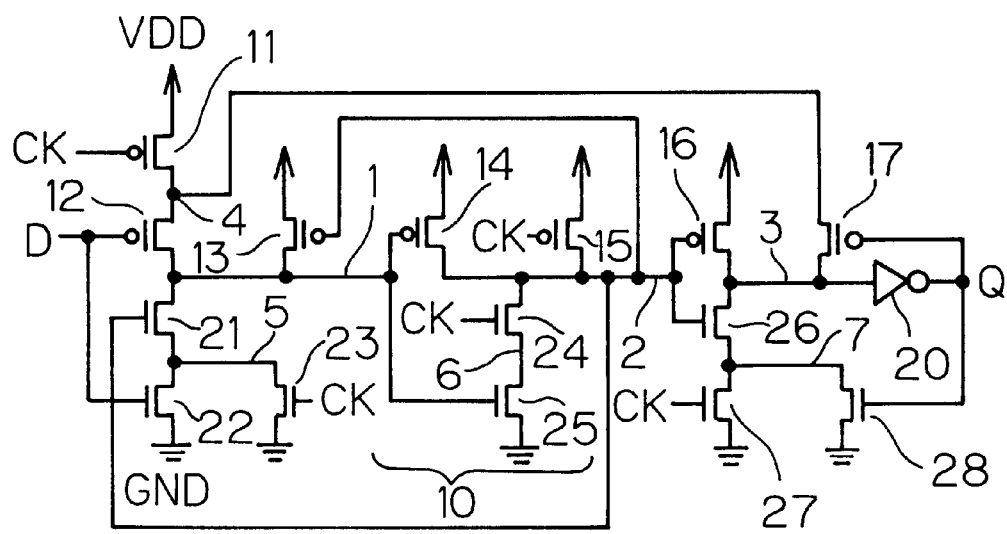
FIG. 2 is a circuit diagram of the flip-flop circuit of a first embodiment of the invention.

FIG. 2. shows a circuit diagram of the flip-flop circuit of a first embodiment of the invention, based on the basic concept described above. This circuit is composed of PMOS transistors 11 to 17, NMOS transistors 21 to 28, and an inverter circuit 20.

The PMOS transistor 11 has its source connected to the supplied voltage VDD, has its drain connected to the node 4, and receives the clock input signal CK at its gate.

The PMOS transistor 12 has its source connected to the node 4, has its drain connected to the node 1, and receives the data input signal D at its gate. The PMOS transistor 13 has its source connected to the supplied voltage VDD, has its gate connected to the node 2, and has its drain connected to the node 1. The NMOS transistor 21 has its source connected to the node 5, has its gate connected to the node 2, and has its drain connected to the node 1. The NMOS transistor 22 has its source connected to the ground level GND, has its drain connected to the node 5, and receives the data input signal D at its gate. The NMOS transistor 23 has its source connected to the ground level GND, has its drain connected to the node 5, and receives the clock input signal CK at its gate.

The PMOS transistor 14 has its source connected to the supplied voltage VDD, has its gate connected. to the node 1, and has its drain connected to the node 2. The PMOS transistor 15 has its source connected to the supplied voltage VDD, has its drain connected to the node 2, and receives the clock input signal CK at its gate. The NMOS transistor 24 has its source connected to the node 6, has its drain connected to the node 2, and receives the clock input signal CK at its gate. The NMOS transistor 25 has its source connected to the ground level GND., has its gate connected to the node 1, and has its drain connected to the node 6.

These PMOS transistors 11 to 15 and NMOS transistors 21 to 25 constitute the master latch. Among these, the PMOS transistors 14 and 15 and the NMOS transistors 24 and 25 form a NAND gate 10.

The PMOS transistor 16 has its source connected to the supplied voltage VDD, has its gate connected to the node 2, and has its drain connected to the node 3. The PMOS transistor 17 has its source connected to the node 4, has its drain connected to the node 3, and receives the data output signal Q at its gate. The NMOS transistor 26 has its source connected to the node 7, has its gate connected to the node 2, and has its drain connected to the node 3. The NMOS transistor 27 has its source connected to the ground level GND, has its drain connected to the node 7, and receives the clock input signal CK at its gate.

The NMOS transistor 28 has its source connected to the ground level GND, has its drain connected to the node 7, and receives the data output signal Q at its gate. The node 3 is connected to the input of the inverter circuit 20, which yields the data output signal Q at its output. These PMOS transistors 11, 16, and 17 and NMOS transistors 26 to 28, together with the inverter circuit 20, constitute the slave latch.

In the master latch, the data input signal D is read while the clock input signal CK is at a low level, and the data thus read is held at the node 2 while the clock input signal CK is at a high level. On the other hand, in the slave latch, the level at the node 2 is read to output the data output signal Q while the clock input signal CK is at a high level, and this output data is held while the clock input signal CK is at a low level.

Next, how these components operate will be described in more detail. When the data input signal D is at a low level and the clock input signal CK is also at a low level, the PMOS transistors 11 and 12 remain on, and the NMOS transistors 22 and 23 remain off. The node 1 and the gate of the NMOS transistor 24 serve as the input terminals of the HAND gate 10, and the clock input signal CK applied to the gate of the NMOS transistor 24 is now at a low level. Therefore, the NAND circuit 10 maintains node 2, which. serves as its output terminal, at a high level. Thus, the PMOS transistor 13 remains off, and therefore the supplied voltage VDD is kept supplied to the node 1, maintaining the node 1 at a high level.

One the other hand, in the slave latch, the high level at the node 2 maintains the PMOS transistor 16 off, and the low level in the clock input signal CK maintains the NMOS transistor 27 off. Accordingly, the data D read by the master latch is not transferred to the slave latch. The levels observed at this time at the nods 1 and 2 are listed in Table 1 below in the form of a truth table. In Tables 1 and 2, L represents a low level, and H represents a high level.

TABLE 1

| D | CK | Node 1 | Node 2 | Node 3 | Q |
|---|----|--------|--------|--------|---|
| L | L  | H      | H      | —      | — |
| L | H  | H      | L      | H      | L |
| L | L  | H      | H      | H      | L |
| H | L  | L      | H      | —      | — |
| H | H  | L      | H      | L      | H |
| H | L  | L      | H      | L      | H |

Next, when the clock input signal CK turns to a high level, since this happens while the node 1 is at a high level, the NAND circuit 10 turns the level at the node 2, which serves as its output terminal, to a low level. This turns the PMOS transistor 13 on, turns the NMOS transistor 21 off, and turns the NMOS transistor 23 on. As a result, irrespective of the level of the data input signal D, the node 1 is maintained at a high level. On the other hand, in the slave latch, the NMOS transistor 27 is turned on, and the level at the node 2 turns to a low level. As a result, the PMOS transistor 16 is turned on, and the NMOS transistor 26 is turned off. This turns the level at the node 3 to a high level, and the inverter circuit 20, which inverts the level at the node 3, outputs a low level as the output signal Q. The levels observed at this time are also listed in Table 1. Note that the levels observed in the subsequent states described below are also listed in Table 1.

Next, when the clock input signal CK turns back to a low level, master latch starts reading new data and, when the data input signal D is at a low level, just as described above, the nodes 1 and 2 are both kept at a high level. On the other hand, in the slave latch, the PMOS transistor 16 is turned on, and the NMOS transistors 27 and 28 are turned off. As a result, the data from the master latch is no longer read and, since the PMOS transistors 11 and 17 are now on, the node 3 is maintained at a high level, and the data output signal Q is kept at a low level.

Thus, the low level in the data input signal D, which was read by the master latch when the clock input signal CK was at a low level, is read by the slave latch on the rising edge of the clock input signal CK. In this way, this master-slave flip-flop circuit outputs a low level as the data output signal Q.

By contrast, when the data input signal D is at a high level and the clock input signal CK is at a low level, the node 2, which serves as the output terminal of the NAND circuit 10 is kept at a high level irrespective of the level of the data input signal D, and the clock input signal CK is at a low level. Thus, no data is read by the slave latch. Moreover, the PMOS transistors 12 remain off, and the NMOS transistors 21 and 22 remain on, and thus the ground level is maintained supplied to the node 1 through the NMOS transistors 21 and 22, keeping the node 1 at a low level.

Next, when the clock input signal CK turns to a high level, in the master latch, since the node 1 is now at a low level, the PMOS transistor 14 is turned on, and the NMOS transistor 25 is turned off. Thus, the node 2 is maintained at a high level. Now that the clock input signal CK is at a high level, the PMOS transistor 11 is turned off, and the NMOS transistor 23 is turned on. As a result, the NMOS transistor 21 is kept on, and therefore the data input signal D is no longer read. Thus, the node 1 is kept at a low level.

On the other hand, in the slave latch, the PMOS transistor 16 is turned off, and the NMOS transistors 26 and 27 are turned on. This turns the level at the node 3 to a low level. As a result, the inverter circuit 20 turns the data output signal Q to a high level. Here, note that, since the PMOS transistor 11 is off now, the supplied voltage VDD is never delivered to the node 3 through the PMOS transistor 17.

Next, when the clock input signal CK turns to a low level, the master latch starts reading the data input signal D again and, when the data input signal D is at a high level, just as described above, the node 1 is kept at a low level and the node 2 is maintained at high level. On the other hand, in the slave latch, the PMOS transistors 16 and 17 are turned off, and the NMOS transistors 26 and 28 are turned on. As a result, the node 3 is kept at a low level, and the data output signal Q is maintained at a high level. This is how the flip-flop circuit of the first embodiment operates.

As described above, the circuit of the first embodiment is configured as a D flip-flop circuit consisting of a master latch and a slave latch, and it includes one CMOS NAND gate 10. In contrast to the conventional flip-flop circuit described earlier (FIG. 8), which operates on two signals CKX and CK1 produced from a clock signal CK, the flip-flop circuit of the first embodiment (FIG. 2) operates on a single-phase, single-polarity clock input signal CK alone.

As a result, in the conventional flip-flop circuit described earlier (FIG. 8), producing the signals CKX and CK1 through the inverter circuits 200 and 201 causes a delay in those signals, thereby operating the flip-flop circuit the hold time, i.e. the period of time that needs to be secured with respect to a rising edge of the clock input signal CK to hold the data input signal D in the master latch, needs to be at lest longer than the delay arising in the inverter circuits 200 and 201. By contrast, the flip-flop circuit of the first embodiment uses the clock input signal CK without any delay, and thus requires a shorter hold time than the conventional flip-flop circuit described earlier (FIG. 8). This make it possible to operate the flip-flop circuit of the first embodiment with a clock input signal CK having a shorter period, and thus at a higher speed.

Moreover, at the node 2 between the master and slave latches, no transfer gate is used to control the flow of a signal. This helps reduce the total changes of signals throughout the circuit, and thus contributes to lower power consumption.

Moreover, in the conventional flip-flop circuit described earlier (FIG. 8), irrespective of the level of the data input signal D, every time the clock input signal CK changes its level, currents flow to charge/discharge the gate capacitors of a total of 12 transistors included in the six PMOS and six NMOS transistors constituting the inverter circuits 200 and 201, and the transfer gates 202, 205, 206, and 209 as well as the drain capacitors in the inverter circuits 200 and 201. By contrast, in the flip-flop circuit of the first embodiment, when the data input signal D is at a low level, in response to the clock input signal CK, currents flow to charge/discharge the gate capacitors of a total of as few as nine transistors 11, 13, 21, 23, 15, 24, 16, 26, and 27 and the drain capacitor at the node 2; on the other hand, when the data input signal D is at a high level, currents flow to charge/discharge the gate capacitors of a total of as few as five transistors 11, 23, 15, 24, and 27. This makes it possible to achieve lower power consumption, minimize the need for heat dissipation means, and thus reduce production cost.

Moreover, in the flip-flop circuit of the first embodiment, the PMOS transistor 11 is shared between the master and slave latches, and thereby a reduction is achieved in the number of transistors required. Specifically, whereas the conventional flip-flop circuit described earlier (FIG. 8) requires 20 transistors, the flip-flop circuit of the first embodiment requires only 17 transistors, and this offers an additional advantage of a smaller LSI chip area. Note that the inverter circuit 20 is composed of a PMOS transistor and an NMOS transistor connected in series.

Figure 3:
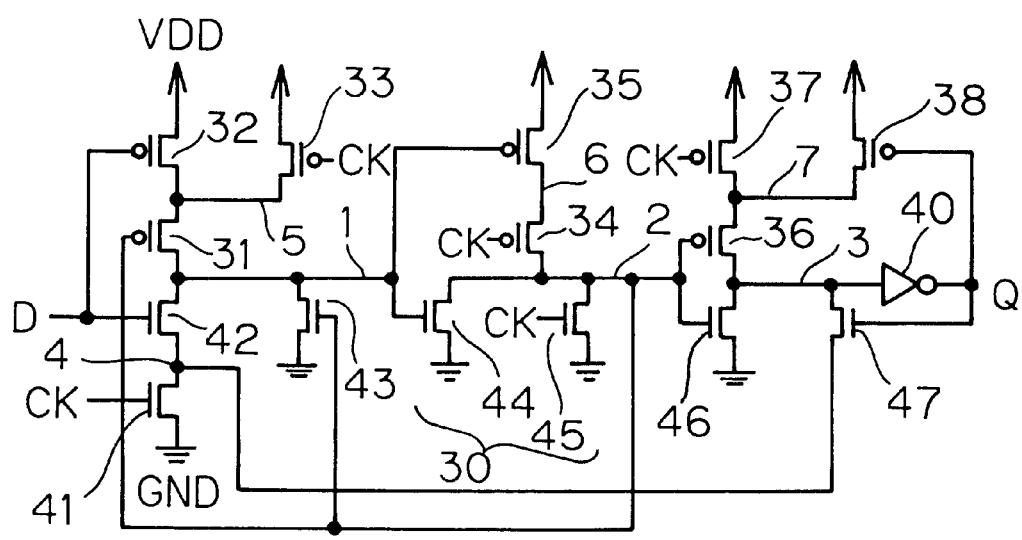
FIG. 3 is a circuit diagram of the flip-flop circuit of a second embodiment of the invention.

FIG. 3 shows a circuit diagram of the flip-flop circuit of a second embodiment of the invention, also based on the basic concept shown in FIG. 1. In the flip-flop circuit of the second embodiment, when the clock input signal CK is at a high level, the master latch reads the data input signal D, and, on a trailing edge of the clock input signal CK, the slave latch reads the data, and outputs a low level as the data output signal Q.

The PMOS transistor 32 has its source connected to the supplied voltage VDD, has its drain connected to the node 5, and receives the data input signal D at its gate. The PMOS transistor 33 has its source connected to the supplied voltage VDD, has its drain connected to the node 5, and receives the clock input signal CK at its gate. The PMOS transistor 31 has its source connected to the node 5, has its gate connected to the node 2, and has its drain connected to the node 1.

The NMOS transistor 42 has its source connected to the node 4, has its drain connected to the node 1, and receives the data input signal D at its gate. The NMOS transistor 41 has its source connected to the ground level GND, has its drain connected to the node 4, and receives the clock input signal CK at its gate. The NMOS transistor 43 has its source connected to the ground level GND, has its gate connected to the node 2, and has its drain connected to the node 1.

The PMOS transistor 35 has its source connected to the supplied voltage VDD, has its gate connected to the node 1, and has its drain connected to the node 6. The PMOS transistor 34 has its source connected to the node 6, has its drain connected to the node 2, and receives the clock input signal CK at its gate. The NMOS transistor 44 has its source connected to the ground level GND, has its gate connected to the node 1, and has its drain connected to the node 2. The NMOS transistor 45 has its source connected to the ground level GND, has its drain connected to the node 2, and receives the clock input signal CK at its gate.

These PMOS transistors 31 to 35 and NMOS transistors 41 to 45 constitute the master latch. Among these, the PMOS transistors 34 and 35 and the NMOS transistors 44 and 45 form a NOR gate 30.

The PMOS transistor 37 has its source connected to the supplied voltage VDD, has its drain connected to the node 7, and receives the clock input signal CK at its gate. The PMOS transistor 38 has its source connected to the supplied voltage VDD, has its drain connected to the node 7, and receives the data output signal Q at its gate. The PMOS transistor 36 has its source connected to. the node 7, has its gate connected to the node 2, and has its drain connected to the node 3. The NMOS transistor 46 has its source connected to the ground level GND, has its gate connected to the node 2, and has its drain connected to the node 3.

The NMOS transistor 47 has its source connected to the node 4, has its drain connected to the node 3, and receives the data output signal Q at its gate. The node 3 is connected to the input of an inverter circuit 40, which yields the data output signal Q at its output. These PMOS transistors 36 to 38 and NMOS transistors 41, 46, and 47, together with the inverter circuit 40, constitute the slave latch.

Next, how the flip-flop circuit of the second embodiment operates will be described. Table 2 illustrates the operation of this flip-flop circuit in the same form as Table 1. When the data input signal D is at a high level and the clock input signal CK is at a high level, the PMOS transistors 31 and 32 remain off, and NMOS transistors 41 and 42 remain on. Thus, the node 1 is kept at a low level. At this time, the node 2 is also maintained at a low level, and therefore no data is transferred to the slave latch.

TABLE 2

| D | CK | Node 1 | Node 2 | Node 3 | Q |
|---|----|--------|--------|--------|---|
| H | H  | L      | L      | —      | — |
| H | L  | L      | H      | L      | H |
| H | H  | L      | L      | L      | H |
| L | H  | H      | L      | —      | — |
| L | L  | H      | L      | H      | L |
| L | H  | H      | L      | H      | L |

Next, when the clock input signal CK turns to a low level, while the node 1 is maintained at a low level and the PMOS transistor 35 is kept on, the PMOS transistor 34 is turned on, and NMOS transistor 45 is turned off. Thus, the level at the node 2 turns to a high level. Moreover, the PMOS transistor 31 is turned off, and the NMOS transistor 43 is turned on. As a result, the data input signal D is no longer read, and the node 1 is-kept at a low level. On the other hand, in the slave latch, the PMOS transistor 36 is turned off, and the NMOS transistor 46 is turned on. As a result, the level at the node 3 turns to a low level, and the data output signal Q turns to a high level.

Next, when the clock input signal CK turns back to a high level, the master latch starts reading the input signal D again, and, when the data input signal D is at a high level, the nodes 1 and 2 turn to a low level. On the other hand, in the slave latch, the NMOS transistors 41 and 47 are turned on, and the PMOS transistor 38 is turned off. As a result, the level at the node 3 turns to a low level, and the data output signal Q is maintained at a high level.

By contrast, when the data input signal D is at a low level and the clock input signal CK is at a high level, the NOR gate 30 receives, at the gate of the NMOS transistor 45, the high level in the clock input signal CK. As a result, the nor gate 30 turns the level at the node 2, which serves its output terminal, to a low level. This turns the PMOS transistor 31 on, and turns the NMOS transistor 43 off. At this time, since the data input signal D is at a low level, the PMOS transistor 32 remains on, and the NMOS transistor 42 remains off. As a result, the supplied voltage VDD is maintained to the node 1, keeping the node 1 at a high level.

On the other hand, in the slave latch, since the node 2 is now at a low level, the NMOS transistor 46 remains off, and, since the clock input signal CK is at a high level, the PMOS transistor 37 remains off. As a result, the data D read by the master latch is not transferred to the slave latch.

Next, when the clock input signal CK turns to a low level, in the master latch, since the node 1 is now at a low level, the PMOS transistor 35 remains on, and thus the PMOS transistor 34 is turned on and the NMOS transistor 45 is turned off. Thus, the node 2 is kept at a low level. Moreover, since the PMOS transistors 31 and 33 remain on and the NMOS transistors 41 and 43 remain off, irrespective of the level of the data input signal D, the node 1 is kept at a high level. On the other hand, in the slave latch, the PMOS transistor 37 is turned on, and thus the supplied voltage VDD is delivered to the node 3 through the PMOS transistor 36, turning the level at the node 3 to a high level. As a result, the inverter cirtcuit 40 outputs a low level as the data output signal Q.

Next, when the clock input signal CK turns back to a high level, the master latch starts reading the data input signal D again, and, when the data input signal D is at a low level, the level at the node 1 turns to a high level, and the level at the node 2 turns to a low level. On the other hand, in the slave latch, the PMOS transistors 36 and 38 are turned on, and the NMOS transistor 47 is turned off. As a result, the node 3 is maintained at a high level, and the data output signal Q is kept at a low level. The flip-flop circuit of the second embodiment operates in this way, as outlined in Table 2.

As described above, the circuit of the-second embodiment is configured as a D flip-flop circuit consisting of a master latch and a slave latch, and it includes one CMOS NOR gate 30. This flip-flop circuit, just like that of the first embodiment (FIG. 2), operates on a single-phase, single-polarity clock input signal CK alone. Thus, this flip-flop circuit can be operated at a high speed and with low power consumption.

Moreover, in the flip-flop circuit of the second embodiment, when the data input signal D is at a high level, currents flow to charge/discharge the gate capacitors of a total of as few as nine transistors 41, 43, 31, 33, 45, 34, 46, 36, and 37 and the drain capacitor at the node 2; on the other hand, when the data input signal D is at a low level, currents flow to charge/discharge the gate capacitors of a total of as few as five transistors 41, 33, 45, 34, and 37. Thus, this flip-flop circuit operates with lower power consumption than the conventional flip-flop circuit described earlier (FIG. 8).

Moreover, in the flip-flop circuit of the second embodiment, the NMOS transistor 41 is shared between the master and slave latches, and thereby a reduction is achieved in the number of transistors required. Accordingly, this flip-flop circuit requires only 17 MOS transistors, and this offers an additional advantage of a smaller LSI chip area as compared with the conventional flip-flop circuit described earlier (FIG. 8).

Figure 4:
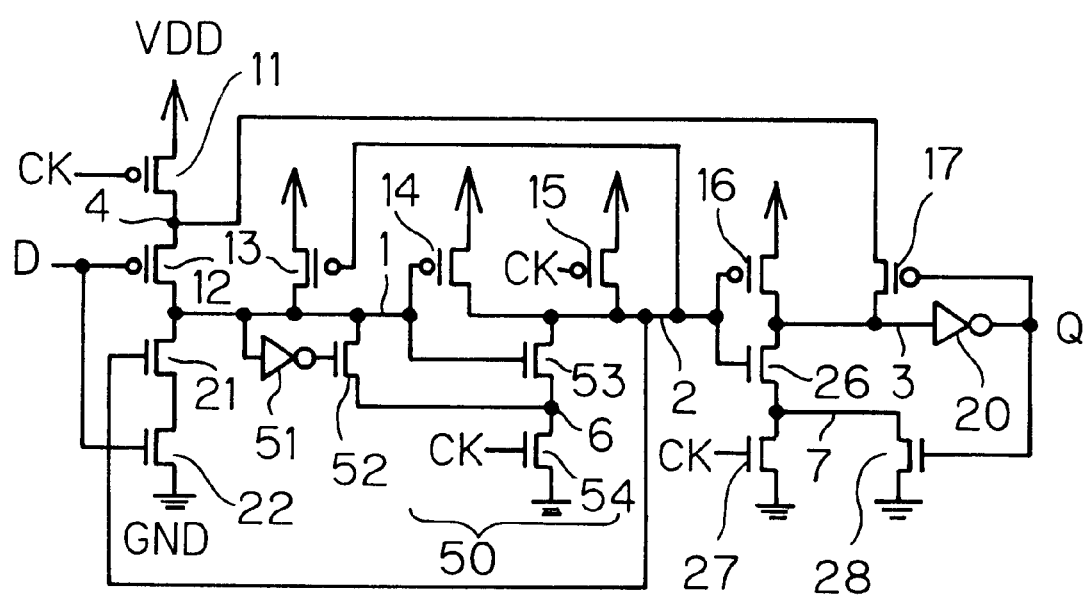
FIG. 4 is a circuit diagram of the flip-flop circuit of a third embodiment of the invention.

FIG. 4 shows a circuit diagram of the flip-flop circuit of a third embodiment of the invention. In the flip-flop circuit of the already-described first embodiment (FIG. 2), when the data input signal D is at a low level, as the clock input signal CK turns from a low level to a high level, the node 2 turns from a high level to a low level. This turns off the NMOS transistor 21, and thereafter, until the PMOS transistor 13 is turned on, i.e. until the holding of the data is completed, a through current flows, on the one hand, through the PMOS transistors 11 and 12 and then through the NMOS transistors 21 and 23 and, on the other hand, through the PMOS transistor 13 and then through the NMOS transistors 21 and 23. This problem has been overcome in the flip-flop circuit of the third embodiment.

In FIG. 4, such elements as are found also in FIG. 2 are identified with the same reference numerals and symbols, and overlapping explanations will not be repeated. Specifically, out of the elements constituting the circuit of the third embodiment, the PMOS transistors 11 to 17, the NMOS transistors 21, 22, and 26 to 28, and the inverter circuit 20 are interconnected substantially in the same way as in the first embodiment.

In addition, in the third embodiment, the node 1 is connected to the input of an inverter circuit 51, whose output is connected to the gate of the NMOS transistor 52. The NMOS transistor 52 has its source connected to the node 6, and has its drain connected to the node 1. The NMOS transistor 53 has its source connected to the node 6, has its gate connected to the node 1, and has its drain connected to the node 2. The NMOS transistor 54 has its source connected to the ground level GND, has its drain connected to the node 6, and receives the clock input signal CK at its gate. The PMOS transistors 14 and 15 and the NMOS transistors 53 and 54 form a NAND gate 50.

When the data input signal D is at a low level and the clock input signal CK is at a low level, the nodes 1 and 2 are both at a high level. Accordingly, the inverter circuit 51 outputs a low level. At this time, the gate of the NMOS transistor 52 is at a low level, and therefore, even when the clock input signal CK turns to a high level, no through current flows through the NNIOS transistor 52. Moreover, the level at the node 2 turns to a low level, the PMOS transistor 13 is turned on, the NMOS transistor21 is turned off, and thus the node 1 is kept at a high level. In other respects, the flip-flop circuit of the third embodiment operates in the same way as that of the first embodiment, as outlined in Table 1.

Moreover, in the third embodiment, the master latch lacks the NMOS transistor 23 (see FIG. 2) that is provided for a data holding purpose in the first embodiment, and instead shares the NMOS transistor 54 that is provided in the NAND gate 50 on the ground level GND side. This contributes to a reduction of the number of transistors used.

In the third embodiment, when the data input signal D is at a low level, in response to a change in the clock input signal CK, currents flow to charge/discharge the gate capacitors of a total of eight MOS transistors 11, 13, 21, 54, 15, 16, 26, and 27 and the drain capacitor at the node 2; on the other hand, when the data input signal D is at a high level, currents flow to charge/discharge the gate capacitors of a total of four MOS transistors 11, 15, 54, and 27. Thus, a further reduction of power consumption is achieved.

Moreover, the PMOS transistor 11, which receives the clock input signal CK at its gate, is shared between the master and slave latches. Thus, a further reduction is achieved in the number of MOS transistors used. As a result, the flip-flop circuit of the third embodiment requires only 19 transistors, and this offers an additional advantage of a smaller LSI chip area as compared with the conventional flip-flop circuit described earlier (FIG. 8).

The flip-flop circuit of the third embodiment operates on a single-phase, single-polarity clock input signal CK, and its master latch is provided with an inverter circuit 51 that makes stable holding of data possible. As a result, this flip-flop circuit requires an even shorter hold time than those of the already-described first and second embodiment, and therefore can be operated at an even higher speed.

Figure 5:
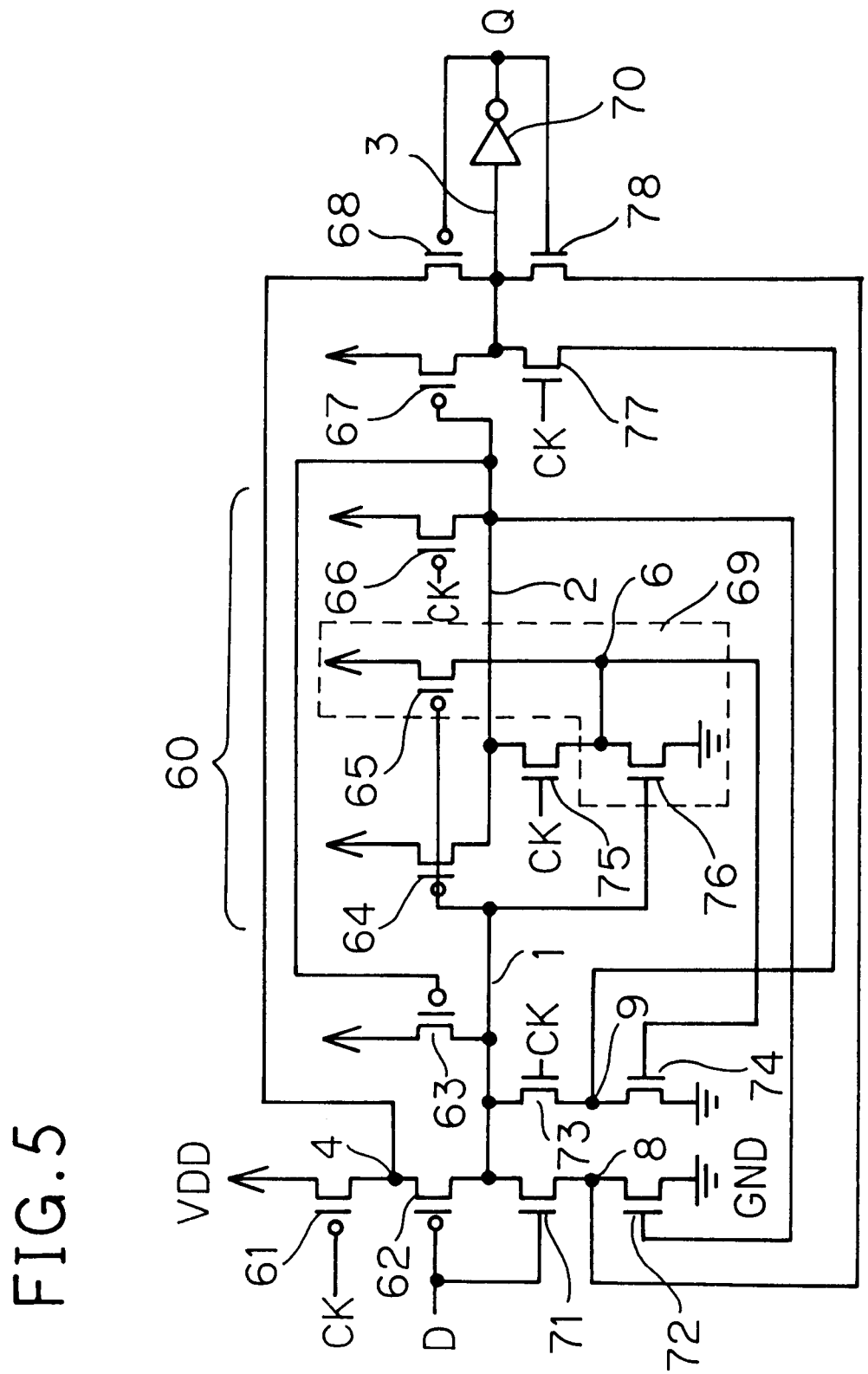
FIG. 5 is a circuit diagram of the flip-flop circuit of a fourth embodiment of the invention.

FIG. 5 shows a circuit diagram of the flip-flop circuit of a fourth embodiment of the invention, also based on the basic concept shown in FIG. 1. This flip-flop circuit is configured as a D flip-flop circuit composed of a master latch and a slave latch, and operates on a single-phase, single-polarity clock input signal CK. In addition, in this flip-flop circuit, appropriate measures are taken to minimize the through current that occurs when the data in the master latch is transferred to the slave latch. How this flip-flop circuit is configured and how it operates will be described in detail below.

The PMOS transistor 61 has its source connected to the supplied voltage VDD, has its drain connected to the node 4, and receives the clock input signal CK at its gate. The PMOS transistor 62 has its source connected to the node 4, has its drain connected to the node 1, and receives the data input signal D at its gate. The PMOS transistor 63 has its source connected to the supplied voltage VDD, has its gate connected to the node 2, and has its drain connected to the node 1.

The NMOS transistor 71 has its source connected to the node 8, has its drain connected to the node 1, and receives the data input signal D at its gate. The NMOS transistor 72 has its source connected to the ground level GND, has its gate connected to the node 2, and has its drain connected to the node 8. The NMOS transistor 73 has its source connected to the node 9, has its drain connected to the node 1, and receives the clock input signal CK at its gate. The NMOS transistor 74 has its source-connected to the ground level GND, has its gate connected to the node 6, and has its drain connected to the node 9.

The PMOS transistor 64 has its source connected to the supplied voltage VDD, has its gate connected to the node 1, and has its drain connected to the node 2. The PMOS transistor 65 has its source connected to the supplied voltage VDD, has its gate connected to the node 1, and has its drain connected to the node 6. The PMOS transistor 66 has its source connected to the supplied voltage VDD, has its drain connected to the node 2, and receives the clock input signal CK at its gate. The NMOS transistor 75 has its source connected to the node 6, has its drain connected to the node 2, and receives the clock input signal CK at its gate. The NMOS transistor 76 has its source connected to the ground level GND, has its gate connected to the node 1, and has its drain connected to the node 6.

These PMOS transistors 61 to 66 and NMOS transistors 71 to 76 constitute the master latch. Among these, the PMOS transistors 64 and 66 and the NMOS transistors 75 and 76 form a NAND gate 60; the PMOS transistor 65 and the NMOS transistor 76 form an inverter circuit 69. Thus, the NMOS transistor 76 is shared between the NAND gate 60 and the inverter circuit 69.

The PMOS transistor 67 has its source connected to the supplied voltage VDD, has its gate connected to the node 2, and has its drain connected to the node 3. The PMOS transistor 68 has its source connected to the node 4, has its drain connected to the node 3, and receives the data output signal Q at its gate. The NMOS transistor 77 has its source connected to the node 9, has its drain connected to the node 3, and receives the clock input signal CK at its gate.

The NMOS transistor 78 has its source connected to the node 8, has its drain connected to the node 3, and receives the data output signal Q at its gate. The node 3. is connected to the input of an inverter circuit 70, which yields the data output signal Q at its output. These PMOS transistors 67, 68, and 61 and NMOS transistors 77, 78, 72, and 74, together with the inverter circuit 70, constitute the slave latch.

The flip-flop circuit of the fourth embodiment operates as follows. Note that, in this circuit, the levels of relevant signals and the levels observed at relevant nodes eventually change just as in the first embodiment, i.e. as listed in Table 1. When the data input signal D is at a low level and the clock input signal CK is also at a low level, the PMOS transistors 61 and 62 remain on, and the NMOS transistor 71 remains off. At this time, since the PMOS transistor 66 is on and the NMOS transistor 75 is off, the node 2 is at a high level, and thus the PMOS transistor 63 is off. As a result, the supplied voltage VDD is delivered to the node 1 through the PMOS transistors 61 and 62, and thus the node 1 is maintained at a high level.

The inverter circuit 69, of which the PMOS transistor 65 and the NMOS transistor 76 both have their gates connected to the node 1, outputs a low level. Accordingly, the NMOS transistor 74 remains off. The high level at the node 1 keeps the PMOS transistor 64 off, and keeps the NMOS transistor 76 on. The high level at the node 2 maintains PMOS transistor 67 off, and the low level in the clock input signal CK maintains NMOS transistor 77 off. As a result, the data in the master latch is not transferred to the slave latch.

Here, in the NAND gate 60, if the NMOS transistors 75 and 76 are connected in the opposite order, i.e. if they are connected in such a way that the NMOS transistor 75 receiving the clock input signal CK at its gate is placed on the ground level GND side and the NMOS transistor 76 with gate connected to the node 1 is placed on the node 2 side, then the node 1 will be at a high level, keeping the NMOS transistor 76 on. Thus, if it is assumed that the threshold voltage of the NMOS transistor 76 is Vn, then the node 6 will be charged until it reaches a voltage VDD−Vn.

When the clock input signal CK turns from a low level to a high level next time, the NMOS transistor 75 on the ground level GND side will be turned on, allowing the charge at the node 6 to be discharged through the NMOS transistor 75 to the ground level GND. By contrast, in the flip-flop circuit of the fourth embodiment, the charging of the node 6 never occurs even in the above-described situation. Accordingly, this flip-flop circuit operates with accordingly lower power consumption.

Similarly, also with the NMOS transistors 73 and 74, and with the NMOS transistors 74 and 77, they are connected in such a way that the NMOS transistors 73 and 77 receiving the clock input signal CK at their gates are placed farther away from the ground level GND than the NMOS transistor 74. This also contributes to a reduction in charging/discharging currents, and thus to lower power consumption.

Next, when the clock input signal CK turns from a low level to a high level, the PMOS transistors 61 and 66 are turned off, and the NMOS transistors 73 and 75 are turned on. The output of the inverter circuit 69 is maintained at a low level before and after the clock input signal CK turns to a high level. Accordingly, the NMOS transistor 74 remains off, and thus, even when the clock input signal CK turns to a high level, turning the NMOS transistor 73 on, no through current flow through the NMOS transistor 73 on the rising edge of the clock input signal CK.

Moreover, since the clock input signal CK turns to a high level while the node 1 is at a high level, the NMOS transistor 75 is turned on. As a result, the ground level GND is delivered to the node 2 through the NMOS transistors 75 and 76, and thus the level at the node 2 turns to a low level. This turns the PMOS transistor 63 on and turns the NMOS transistor 72 off. Thus, the node 1 is maintained stable at a high level. Moreover, the low level at the node 2 turns the PMOS transistor 67 on, and turns the NMOS transistors 72 off. As a result, the supplied voltage VDD is delivered to the node 3, and thus the level at the node 3 turns to a high level. Thus, the inverter 70 turns the data output signal Q to a low level.

Next, when the clock input signal CK turns to a low level, the master latch starts reading new data, and, when the data input signal D is at a low level, just as described above, the nodes 1 and 2 are both maintained at a high level. Now that the node 2 is at a high level and the clock input signal CK is at a low level, the data in the master latch is no longer transferred to the slave latch. Moreover, the PMOS transistor 61 and the NMOS transistor 72 are turned on, and this turns the PMOS transistor 68 on and turns the NMOS transistor 78 off. As a result, the data output signal Q is kept at a low level.

By contrast, when the data input signal D is at a high level and the clock input signal CK is at a low level, the PMOS transistor 66 is turned on, and thus turns the level at the node 2, which serves as the output terminal of the NAND gate 60, to a high level. This turns the PMOS transistor 63 off, and turns the NMOS transistor 72 on. Moreover, the PMOS transistor 62 and the NMOS transistor 75 are turned off, and the NMOS transistor 71 is turned on. As a result, the ground level GND is delivered to the node 1 through the NMOS transistors 71 and 72, and thus the level at the node 1 turns to a low level. This causes the inverter circuit 69 to output a high level, and the NMOS transistor 74 is turned on. Now that the node 2 is at a high level and the clock input signal CK is at a low level, the slave latch reads no data.

Next, when the clock input signal CK turns from a low level to a high level, in the master latch, the PMOS transistors 61 and 66 are turned off. Since the node 6, which serves as the output terminal of the inverter circuit 69, is kept at a high level before and after the clock input signal CK turns to a high level, when the clock input signal CK turns to a high level and the NMOS transistor 73 is turned on, irrespective of the level of the data input signal D, the node 1 is maintained stable at a low level through the NMOS. transistors 73 and 74.

Now that the node 1 is at a low level, the PMOS transistor 64 is kept on, and now that the NMOS transistor 76 is off, the node 2 is kept at a high level. On the other hand, in the slave latch, when the NMOS transistor 77 is turned on, since the PMOS transistors 61 and 67 are now off, the node 3 turns to a low level through the NMOS transistors 74 and 77, and the inverter circuit 70 turns the data output signal Q to a high level.

Next, when the clock input signal CK turns to a low level, the master latch starts reading the data input signal D again, and, when the data input signal D is at a high level, just as described above, the level at the node 1 turns to a low level, and the level at the node 2 turns to a high level. On the other hand, in the slave latch, the node 3 is kept at a low level through the NMOS transistors 72 and 78, and the data output signal Q is maintained at a high level.

Thus, the level of the data input signal D that was read by the master latch when the clock input signal CK was at a low level is read and held as the data output signal Q by the slave latch on the rising edge of the clock input signal CK. In this way, this circuit operates as a master-slave D flip-flop circuit.

As described above, the flip-flop circuit of the fourth embodiment is provided with one CMOS NAND gate 60. Moreover, the flip-flop circuit of the fourth embodiment operates on a single-phase, single-polarity clock input signal CK alone. Moreover, this circuit operates with a shorter hold time, because its master latch uses an inverter circuit 69 to stably hold the data it has read.

In this flip-flop circuit, when the data input signal D is at a low level, in response to a change in the clock input signal CK, currents flow to charge/discharge the gate capacitors of a total of eight MOS transistors 61, 63, 72, 73, 66, 67, 75, and 77 and the drain capacitor at the node 2; on the other hand, when the data input signal D is at a high level, currents flow to charge/discharge the gate capacitors of a total of five MOS transistors 61, 66, 73, 75, and 77. In addition, the inverter circuit 69 and the NMOS transistor 74 eliminate the through current. Thus, the flip-flop circuit of the fourth embodiment operates with lower power consumption than the conventional flip-flop circuit described earlier (FIG. 8). Moreover, the master and slave latches share the circuit composed of the transistors 61, 72, 76, and 74. Thus, the flip-flop circuit of the fourth embodiment requires only 18 MOS transistors, and this offers an additional advantage of a smaller LSI chip area.

Figure 6:
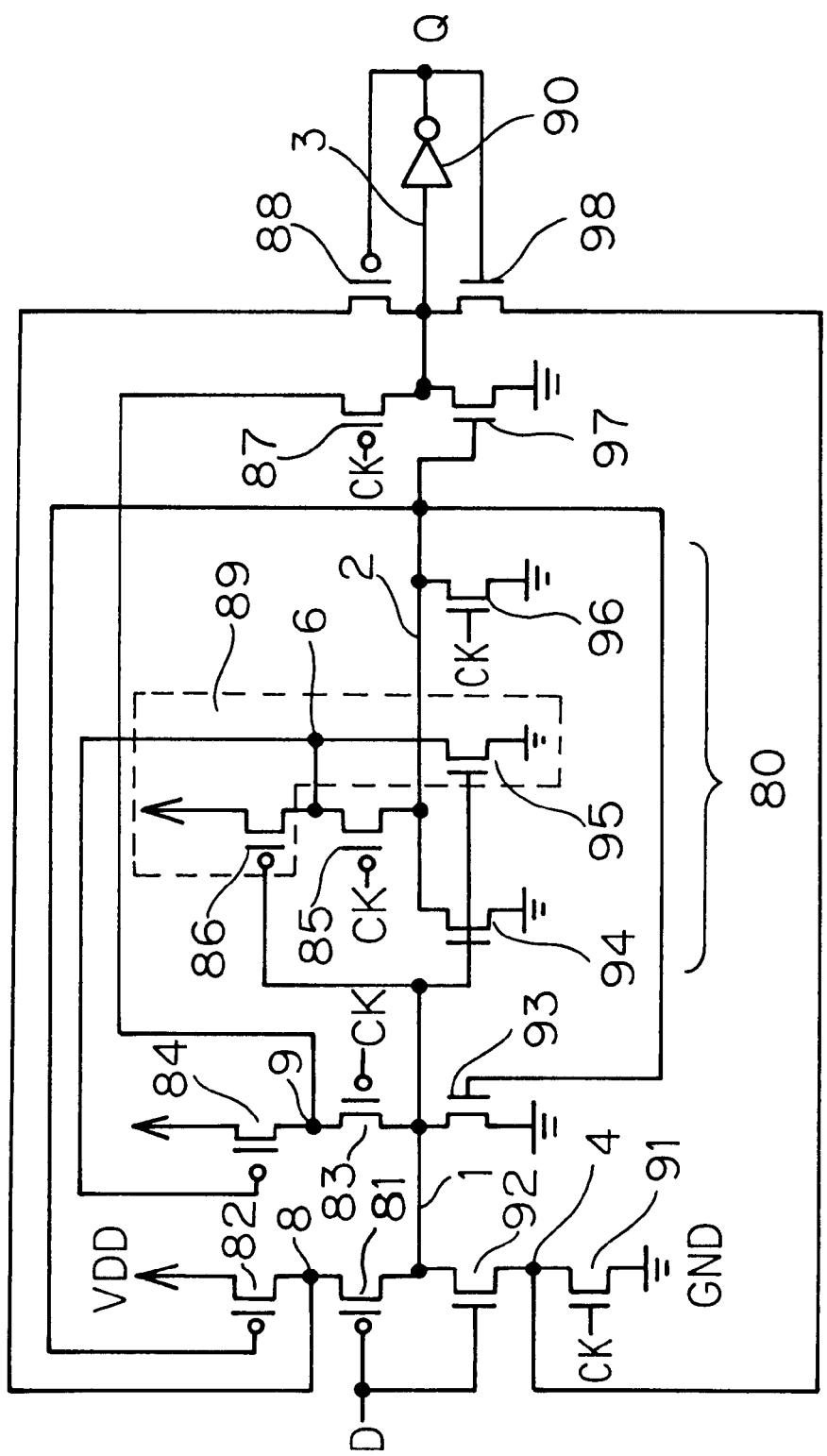
FIG. 6 is a circuit diagram of the flip-flop circuit of a fifth embodiment of the invention.

FIG. 6 shows a circuit diagram of the flip-flop circuit of a fifth embodiment of the invention, also based on the basic concept shown in FIG. 1. The flip-flop circuit of the fifth embodiment is a master-slave flip-flop circuit in which, when the clock input signal CK is at a high level, the data input signal D is read by a master latch and, on the trailing edge of the clock input signal CK, the data thus read is transferred to a slave latch to output a low level as the data output signal Q.

To achieve output of the data output signal Q on the trailing edge of the clock input signal CK, the flip-flop circuit of the fifth embodiment is configured basically in the same manner as that of the above-described fourth embodiment (FIG. 5) but with the NMOS and PMOS transistors arranged in place of each other. Thus, in the fifth embodiment, a reduction in power consumption is achieved on the same principles as in the fourth embodiment.

How the flip-flop circuit of the fifth embodiment is configured will be described below. The PMOS transistor 82 has its source connected to the supplied voltage VDD, has its gate connected to the node 2, and has its drain connected to the node 8. The PMOS transistor 81 has its source connected to the node 8, has its drain connected to the node 1, and receives the data input signal D at its gate. The PMOS transistor 84 has its source connected to the supplied voltage VDD, has its gate connected to the node 6, and has its drain connected to the node 9. The PMOS transistor 83 has its source connected to the node 9, has its drain connected to the node 1, and receives the clock input signal CK at its gate.

The NMOS transistor 92 has its source connected to the node 4, has its drain connected to the node 1, and receives the data input signal D at its gate. The NMOS transistor 91 has its source connected to the ground level GND, has its drain connected to the node 4, and receives the clock input signal CK at its gate. The NMOS transistor 93 has its source connected to the ground level GND, has its gate connected to the node 2, and has its drain connected to the node 1.

The PMOS transistor 86 has its source connected to the supplied voltage VDD, has its gate connected to the node 1, and has its drain connected to the node 6. The PMOS transistor 85 has its source connected to the node 6, has its drain connected to the node 2, and receives the clock input signal CK at its gate. The NMOS transistor 94 has its source connected to the ground level GND, has its gate connected to the node 1, and has its drain connected to the node 2. The NMOS transistor 95 has its source connected to the ground level GND, has its gate connected to the node 1, and has its drain connected to the node 6. The NMOS transistor 96 has its source connected to the ground level GND, has its drain connected to the node 2, and receives the clock input signal CK at its gate.

These PMOS transistors 81 to 86 and NMOS transistors 91 to 96 constitute the master latch. Among these, the PMOS transistors 85 and 86 and the NMOS transistors 94 and 96 form a NOR gate 80; the PMOS transistor 86 and the NMOS transistor 95 form an inverter circuit 89. Thus, the PMOS transistor 86 is shared between the NOR gate 80 and the inverter circuit 89.

The PMOS transistor 87 has its source connected to the node 9, has its drain connected to the node 3, and receives the clock input signal CK at its gate. The PMOS transistor 88 has its source connected to the node 8, has its drain connected to the node 3, and receives the data output signal Q at its gate. The NMOS transistor 97 has its source connected to the ground level GND, has its gate connected to the node 2, and has its drain connected to the node 3.

The NMOS transistor 98 has its source connected to the node 4, has its drain connected to the node 3, and receives the data output signal Q at its gate. The node 3 is connected to the input of an inverter circuit 90, which yields the data output signal Q at its output. These PMOS transistors 82, 84, 87, and 88 and NMOS transistors 91, 97, and 98, together with the inverter circuit 90, constitute the slave latch.

Next, how the flip-flop circuit of the fifth embodiment operates will be described below. Note that, in this circuit, the levels of relevant signals and the levels observed at relevant nodes eventually change just as in the second embodiment, i.e. as listed in Table 2. When the data input signal D is at a high level and the clock input signal CK is also at a high level, the PMOS transistor 85 remains off, and the NMOS transistor 96 remains on, and thus the node 2 is kept at a low level. Moreover, the PMOS transistors 81 and 83 remain off, and the NMOS transistors 91 and 92 remain on, and thus the node 1 is maintained at a low level. Now that the node 2 is kept at a low level and the PMOS transistor 87 remains off, no data is transferred to the slave latch. Moreover, the output of the inverter circuit 89 maintains the PMOS transistor 84 off.

Next, when the clock input signal CK turns to a low level, the PMOS transistors 83 and 85 are turned on, and the NMOS transistors 91 and 96 are turned off. Since the output of the inverter circuit 89 is kept at a low level before and after the clock input signal CK turns to a low level, and the PMOS transistor 84 remains off, no through current flows through the PMOS transistor 84 on the trailing edge of the clock input signal CK.

Moreover, the PMOS transistors 85 and 86 are turned on, and the NMOS transistors 94 and 96 are turned off, and thus the level at the node 2 turns to a high level. This turns the PMOS transistor 82 off and turns the NMOS transistor 93 on, and thus the node 1 is stably kept at a low level. Moreover, the PMOS transistor 84 is turned off, the NMOS transistor 97 is turned on, and thus the level at the node 3 turns to a low level. As a result, the inverter circuit 90 turns the data output signal Q to a high level.

Next, when the clock input signal CK turns to a high level, the master latch starts reading new data, and, when the data input signal D is at a high level, the nodes 1 and 2 both turn to a low level. Thus, the data in the master latch is no longer transferred to the slave latch. Moreover, the PMOS transistor 88 is turned off, the NMOS transistor 98 and 91 is turned on, and thus the data output signal Q is maintained at a high level.

By contrast, when the data input signal D is at a low level and the clock input signal CK is at a high level, the level at the node 2, which serves as the output terminal of the NAND gate 80, turns to a low level. Moreover, the PMOS transistors 81 and 82 are turned on, the NMOS transistors 92 and 93 are turned off, and thus the level at the node 1 turns to a high level. At this time, since the node 2 is at a low level, no data is transferred to the slave latch.

Next, when the clock input signal CK turns to a low level, in the master latch, the PMOS transistors 83 and 84 are turned on, and the NMOS transistors 91 and 93 are turned off. Thus, the node 1 is stably kept at a high level, and the node 2 is kept at a low level. On the other hand, in the slave latch, the PMOS transistors 84 and 87 are turned on, and the NMOS transistor 97 is turned off. Thus, the level at the node 3 turns to a high level, and the inverter circuit 90 turns the data output signal Q to a low level.

Next, when the clock input signal CK turns to a high level, the master latch starts reading the data input signal D again, and, when the data input signal D is at a low level, just as described above, the level at the node 1 turns to a high level, and the level at the node 2 turns to a low level. On the other hand, in the slave latch, the PMOS transistors 82 and 88 are turned on, and the NMOS transistor 98 is turned off. Thus, the node 3 is kept at a high level, and the data output signal Q is maintained at a low level.

As described above, the flip-flop circuit of the fifth embodiment is provided with one CMOS NOR gate 80. Moreover, the flip-flop circuit of the fourth embodiment operates on a single-phase, single-polarity clock input signal CK alone. Moreover, this circuit operates with a shorter hold time, because its master latch uses an inverter circuit 89 to stably hold the data it has read.

The flip-flop circuit of the fifth embodiment operates with low power consumption because, in this circuit, appropriate measures are taken to minimize, during signal transition periods, the charging/discharging currents due to the capacitances inherent in the transistors and the through current that flows from the supplied voltage VDD to the ground level GND through PMOS and NMOS transistors. Moreover, the master and slave latches share the PMOS transistor 82, the NMOS transistor 91, and the PMOS transistors 84, and in addition the NOR gate 80 and the inverter circuit 89 share the PMOS transistor 86. This contributes to a reduction in the total number of transistors used. Thus, the flip-flop circuit of the fifth embodiment requires only 18 MOS transistors, and this offers an additional advantage of a smaller LSI chip area as compared with the conventional flip-flop circuit described earlier (FIG. 8).

Figure 7:
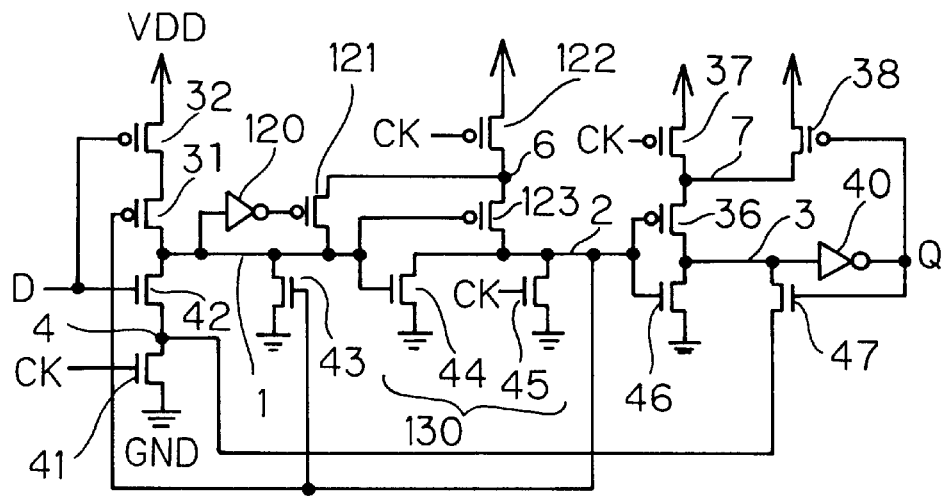
FIG. 7 is a circuit diagram of the flip-flop circuit of a sixth embodiment of the invention.

FIG. 7 shows a circuit diagram of the flip-flop circuit of a sixth embodiment of the invention. In the already-described second embodiment (FIG. 3), when the clock input signal CK turns from a high level to a low level while the data input signal D is at a high level, a through current flows, by way of the node 1, through the PMOS transistors 31 and 33 and the NMOS transistors 41 and 42. This problem has been overcome in the sixth embodiment. Moreover, in the sixth embodiment, the PMOS transistor 33 (see FIG. 3) provided in the above second embodiment is shared by a NOR gate 130 (FIG. 7).

In FIG. 7, such elements as are found also in FIG. 3 are identified with the same reference numerals and symbols, and overlapping explanations will not be repeated. Specifically, out of the elements constituting the circuit of the sixth embodiment, the PMOS transistors 32, 31, and 36 to 38 and the NMOS transistors 41 to 47 are interconnected substantially in the same way as in the second embodiment (FIG. 3). In addition, in the sixth embodiment, the node 1 is connected to the input of an inverter circuit 120, whose output is connected to the gate of a PMOS transistor 121. The PMOS transistor 121 has its source connected to the node 6, and has its drain connected to the node 1.

Another PMOS transistor 122 has its source connected to the supplied voltage VDD, has its drain connected to the node 6, and receives the clock input signal CK at its gate. Still another PMOS transistor 123 has its source connected to the node 6, has its gate connected to the node 1, and has its drain connected to the node 2. The PMOS transistors 122 and 123, together with the NMOS transistors 44 and 45, form a NOR circuit 130. The PMOS transistor 122 is used also to form a circuit that holds the level at the node 1. This contributes to a reduction in the number of transistors used. Specifically, the flip-flop circuit of the sixth embodiment requires only 19 transistors.

As a result, when the clock input signal CK turns from a high level to a low level while the data input signal D is at a high level, the inverter circuit 120 and the PMOS transistor 121 cut off the node 1, and therefore no through current flows. Thus, this flip-flop circuit operates with lower power consumption.

What is claimed is:

1. A static CMOS flip-flop circuit that is composed of a master latch and a slave latch and that operates on a data input signal and a clock input signal fed thereto, wherein the master latch comprises:
a data input circuit that, when the clock input signal is at a first level, reads the data input signal;
a first data holding circuit that, when the clock input signal is at a second level, holds the data read by the data input circuit; and
a signal switching circuit that, when the clock input signal is at the first level, outputs a predetermined level and that, when the clock input signal is at the second level, outputs the data held by the first data holding circuit after inverting it, and the slave latch comprises:
a data output circuit that, when the clock input signal is at the second level, reads an output of the signal switching circuit after inverting it; and
a second data holding circuit that, when the clock input signal is at the first level, holds the data read by the data output circuit;

wherein an output of the data input circuit and an output of the first data holding circuit appear at a first node, and wherein the signal switching circuit comprises:
a first P-channel MOS transistor having a gate connected to the first node, having a source connected to a power source, and having a drain connected to a second node;

a second P-channel MOS transistor having a gate receiving the clock input signal, having a source connected to the power source, and having a drain connected to the second node;

a first N-channel MOS transistor having a gate receiving the clock input signal and having a drain connected to the second node; and a second N-channel MOS transistor having a gate connected to the first node, having a source connected to ground, and having a drain connected to a source of the first N-channel MOS transistor.

2. A flip-flop circuit as claimed in claim 1,
wherein the data input circuit comprises:
a third P-channel MOS transistor having a gate receiving the clock input signal and having a source connected to the power source;
a fourth P-channel MOS transistor having a gate receiving the data input signal, having a source connected to a drain of the third P-channel MOS transistor, and having a drain connected to the first node;
a third N-channel MOS transistor having a gate connected to the second node and having a drain connected to the first node; and
a fourth N-channel MOS transistor having a gate receiving the data input signal, having a source connected to ground, and having a drain connected to a source of the third N-channel MOS transistor.

3. A flip-flop circuit as claimed in claim 2,
wherein the first data holding circuit comprises:
a fifth P-channel MOS transistor having a gate connected to the second node, having a source connected to the power source, and having a drain connected to the first node; and
a fifth N-channel MOS transistor having a gate receiving the clock input signal, having a source connected to ground, and having a drain connected to the source of the third N-channel MOS transistor.

4. A flip-flop circuit as claimed in claim 3,
wherein the data output circuit comprises:
a sixth P-channel MOS transistor having a gate connected to the second node, having a source connected to the power source, and having a drain connected to a third node;
a sixth N-channel MOS transistor having a gate connected to the second node and having a drain connected to the third node; and
a seventh N-channel MOS transistor having a gate receiving the clock input signal, having a source connected to ground, and having a drain connected to a source of the sixth N-channel MOS transistor.

5. A flip-flop circuit as claimed in claim 4,
wherein the second data holding circuit comprises:
an inverter circuit for inverting a signal appearing at the third node;
a seventh P-channel MOS transistor having a gate receiving an output of the inverter circuit, having a source connected to the drain of the third P-channel MOS transistor, and having a drain connected to the third node; and
an eighth N-channel MOS transistor having a gate receiving the output of the inverter circuit, having a source connected to ground, and having a drain connected to the source of the sixth N-channel MOS transistor.

6. A flip-flop circuit as claimed in claim 1,
wherein the data input circuit comprises:

a third P-channel MOS transistor having a gate receiving the clock input signal and having a source connected to the power source;

a fourth P-channel MOS transistor having a gate receiving the data input signal, having a source connected to a drain of the third P-channel MOS transistor, and having a drain connected to the first node;

a third N-channel MOS transistor having a gate receiving the data input signal and having a drain connected to the first node; and a fourth N-channel MOS transistor having a gate connected to the second node, having a source connected to ground, and having a drain connected to a source of the third N-channel MOS transistor.

7. A flip-flop circuit as claimed in claim 6,
wherein the first data holding circuit comprises:
a fifth P-channel MO$ transistor having a gate connected to the second node, having a source connected to the power source, and having a drain connected to the first node;
a sixth P-channel MOS transistor having a gate connected to the first node, having a source connected to the power source, and having a drain connected to the drain of the second N-channel MOS transistor;
a fifth N-channel MOS transistor having a gate receiving the clock input signal and having a drain connected to the first node; and
a sixth N-channel MOS transistor having a gate connected to the drain of the sixth P-channel MOS transistor, having a source connected to ground, and having a drain connected to a source of the fifth N-channel MOS transistor.

8. A flip-flop circuit as claimed in claim 7,
wherein the data output circuit comprises:
a seventh P-channel MOS transistor having a gate connected to the second node, having a source connected to the power source, and having a drain connected to a third node; and
a seventh N-channel MOS transistor having a gate receiving the clock input signal, having a source connected to the drain of the sixth N-channel MOS transistor, and having a drain connected to the third node.

9. A flip-flop circuit as claimed in claim 8,
wherein the second data holding circuit comprises:
an inverter circuit for inverting a signal appearing at the third node;
an eighth P-channel MOS transistor having a gate receiving an output of the inverter circuit, having a source connected to the drain of the third P-channel MOS transistor, and having a drain connected to the third node; and
an eighth N-channel MOS transistor having a gate receiving the output of the inverter circuit, having a source connected to the drain of the fourth N-channel MOS transistor, and having a drain connected to the third node.

10. A static CMOS flip-flop circuit that is composed of a master latch and a slave latch and that operates on a data input signal and a clock input signal fed thereto,
wherein the master latch comprises:
a data input circuit that, when the clock input signal is at a first level, reads the data input signal;
a first data holding circuit that, when the clock input signal is at a second level, holds the data read by the data input circuit; and
a signal switching circuit that, when the clock input signal is at the first level, outputs a predetermined level and that, when the clock input signal is at the second level, outputs the data held by the first data holding circuit after inverting it, and the slave latch comprises:
- a data output circuit that, when the clock input signal is at the second level, reads an output of the signal switching circuit after inverting it; and
- a second data holding circuit that, when the lock input signal is at the first level, holds the data read by the data output circuit;

wherein an output of the data input circuit and an output of the first data holding circuit appear at a first node, and wherein the signal switching circuit comprises:
- a first P-channel MOS transistor having a gate connected to the first node and having a source connected to a power source;
- a second P-channel MOS transistor having a gate receiving the clock input signal, having a source connected to a drain of the first P-channel MOS transistor, and having a drain connected to a second node;
- a first N-channel MOS transistor having a gate connected to the first node, having a source connected to ground, and having a drain connected to the second node; and
- a second N-channel MOS transistor having a gate receiving the clock input signal, having a source connected to ground, and having a drain connected to the second node.

11. A flip-flop circuit as claimed in claim 10,
wherein the data input circuit comprises:
- a third P-channel MOS transistor having a gate receiving the data input signal and having a source connected to the power source;
- a fourth P-channel MOS transistor having a gate connected to the second node, having a source connected to a drain of the third P-channel MOS transistor, and having a drain connected to the first node;
- a third N-channel MOS transistor having a gate receiving the data input signal and having a drain connected to the first node; and
- a fourth N-channel MOS transistor having a gate receiving the clock input signal, having a source connected to ground, and having a drain connected to a source of the third N-channel MOS transistor.

12. A flip-flop circuit as claimed in claim 11,
wherein the first data holding circuit comprises:
- a fifth P-channel MOS transistor having a gate receiving the clock input signal, having a source connected to the power source, and having a drain connected to the source of the fourth P-channel MOS transistor; and
- a fifth N-channel MOS transistor having a gate connected to the second node, having a source connected to ground, and having a drain connected to the first node.

13. A flip-flop circuit as claimed in claim 12,
wherein the data output circuit comprises:
- a sixth P-channel MOS transistor having a gate receiving the clock input signal and having a source connected to the power source;
- a seventh P-channel MOS transistor having a gate connected to the second node, having a source connected to a drain of the sixth P-channel MOS transistor, and having a drain connected to the third node; and
- a sixth N-channel MOS transistor having a gate connected to the second node, having a source connected to ground, and having a drain connected to the third node.

14. A flip-flop circuit as claimed in claim 13,
wherein the second data holding circuit comprises:
- an inverter circuit for inverting a signal appearing at the third node;
- an eighth P-channel MOS transistor having a gate receiving an output of the inverter circuit, having a source connected to the power source, and having a drain connected to the source of the seventh P-channel MOS transistor; and
- a seventh N-channel MOS transistor having a gate receiving the output of the inverter circuit, having a source connected to the drain of the fourth N-channel MOS transistor, and having a drain connected to the third node.

15. A flip-flop circuit as claimed in claim 10,
wherein the data input circuit comprises:
- a third P-channel MOS transistor having a gate connected to the second node and having a source connected to the power source;
- a fourth P-channel MOS transistor having a gate receiving the data input signal, having a source connected to a drain of the third P-channel MOS transistor, and having a drain connected to the first node;
- a third N-channel MOS transistor having a gate receiving the data input signal and having a drain connected to the first node; and
- a fourth N-channel MOS transistor having a gate receiving the clock input signal, having a source connected to ground, and having a drain connected to a source of the third N-channel MOS transistor.

16. A flip-flop circuit as claimed in claim 15,
wherein the first data holding circuit comprises:
- a fifth N-channel MOS transistor having a gate connected to the first node, having a source connected to ground, and having a drain connected to a drain of the first P-channel MOS transistor;
- a fifth P-channel MOS transistor having a gate connected to a drain of the fifth N-channel MOS transistor and having a source connected to the power source;
- a sixth P-channel MOS transistor having a gate receiving the clock input signal, having a source connected to a drain of the fifth P-channel MOS transistor, and having a drain connected to the first node; and
- a sixth N-channel MOS transistor having a gate connected to the second node, having a source connected to ground, and having a drain connected to the first node.

17. A flip-flop circuit as claimed in claim 16,
wherein the data output circuit comprises:
- a seventh N-channel MOS transistor having a gate connected to the second node, having a source connected to ground, and having a drain connected to a third node; and
- a seventh P-channel MOS transistor having a gate receiving the clock input signal, having a source connected to the drain of the fifth P-channel MOS transistor, and having a drain connected to the third node.

18. A flip-flop circuit as claimed in claim 17,
wherein the second data holding circuit comprises:
- an inverter circuit for inverting a signal appearing at the third node;

an eighth P-channel MOS transistor having a gate receiving an output of the inverter circuit, having a source connected to the drain of the third P-channel MOS transistor, and having a drain connected to the third node; and an eighth N-channel MOS transistor having a gate receiving the output of the inverter circuit, having a source connected to the drain of the fourth N-channel MOS transistor, and having a drain connected to the third node.

19. A static CMOS flip-flop circuit that is composed of a master latch and a slave latch and that operates on a data input signal and a clock input signal fed thereto, wherein the master latch comprises:
a data input circuit that, when the clock input signal is at a first level, reads the data input signal;
a first data holding circuit that, when the clock input signal is at a second level, holds the data read by the data input circuit; and
a signal switching circuit that, when the clock input signal is at the first level, outputs a predetermined level and that, when the clock input signal is at the second level, outputs the data held by the first data holding circuit after inverting it, and wherein the slave latch comprises:
a data output circuit that, when the clock input signal is at the second level, reads an output of the signal switching circuit after inverting it;
a second data holding circuit that, when the clock input signal is at the first level, holds the data read by the data output circuit;
wherein an output of the data input circuit and an output of the first data holding circuit appear at a first node; and wherein the signal switching circuit comprises:
a first P-channel MOS transistor having a gate receiving the clock input signal and having a source connected to a power source;
a second P-channel MOS transistor having a gate connected to the first node, having a source connected to a drain of the first P-channel MOS transistor, and having a drain connected to a second node;
a first N-channel MOS transistor having a gate connected to the first node, having a source connected to ground, and having a drain connected to the second node; and
a second N-channel MOS transistor having a gate receiving the clock input signal, having a source connected to ground, and having a drain connected to the second node.

20. A flip-flop circuit as claimed in claim 19,
wherein the data input circuit comprises:
a third P-channel MOS transistor having a gate receiving the data input signal and having a source connected to the power source;
a fourth P-channel MOS transistor having a gate connected to the second node, having a source connected to a drain of the third P-channel MOS transistor, and having a drain connected to the first node;
a third N-channel MOS transistor having a gate receiving the data input signal and having a drain connected to the first node; and
a fourth N-channel MOS transistor having a gate receiving the clock input signal, having a source connected to ground, and having a drain connected to a source of the third N-channel MOS transistor.

21. A flip-flop circuit as claimed in claim 20,
wherein the first data holding circuit comprises:
a first inverter circuit for inverting a signal appearing at the first node;
a fifth P-channel MOS transistor having a gate receiving an output of the first inverter circuit, having a source connected to the drain of the first P-channel MOS transistor, and having a drain connected to the first node;
a fifth N-channel MOS transistor having a gate connected to the second gate, having a source connected to ground, having a drain connected to the first node.

22. A flip-flop circuit as claimed in claim 21,
wherein the data output circuit comprises:
a sixth P-channel MOS transistor having a gate receiving the clock input signal and having a source connected to the power source;
a seventh P-channel MOS transistor having a gate connected to the second node, having a source connected to a drain of the sixth P-channel MOS transistor, and having a drain connected to a third node; and
a sixth N-channel MOS transistor having a gate connected to the second node, having a source connected to ground, and having a drain connected to the third node.

23. A flip-flop circuit as claimed in claim 22,
wherein the second data holding circuit comprises:
a second inverter circuit for inverting a signal appearing at the third node;
an eighth P-channel MOS transistor having a gate receiving an output of the second inverter circuit, having a source connected to the power source, and having a drain connected to the drain of the sixth P-channel MOS transistor; and
a seventh N-channel MOS transistor having a gate receiving the output of the second inverter circuit, having a source connected to the drain of the fourth N-channel MOS transistor, and having a drain connected to the third node.

* * * * *